United States Patent [19]

Heijman

[11] Patent Number: 4,933,318
[45] Date of Patent: Jun. 12, 1990

[54] PLASMA ETCH OF MASKED SUPERCONDUCTOR FILM

[75] Inventor: Maritza G. J. Heijman, Eindhoven, Netherlands

[73] Assignee: U.S. Philips Corporation, New York, N.Y.

[21] Appl. No.: 283,417

[22] Filed: Dec. 12, 1988

[30] Foreign Application Priority Data

Dec. 16, 1987 [NL] Netherlands .................... 8703039

[51] Int. Cl.⁵ .................... H01L 21/308; H01L 39/00
[52] U.S. Cl. ........................ 505/1; 505/728; 156/643; 156/652; 156/659.1; 427/63
[58] Field of Search ............... 505/728, 1, 741, 820; 156/643, 659.1, 667, 632, 652, 656; 427/63

[56] References Cited

U.S. PATENT DOCUMENTS

| | | | |
|---|---|---|---|
| 4,560,435 | 12/1985 | Brown et al. | 505/820 |
| 4,657,844 | 4/1987 | Shu et al. | 156/643 |
| 4,683,024 | 7/1987 | Miller et al. | 156/643 |
| 4,687,543 | 8/1987 | Bowker | 156/643 |
| 4,690,729 | 9/1987 | Douglas | 156/643 |

OTHER PUBLICATIONS de Vries et al., Preparation Patterning and Properties of Thin $YBa_2Cu_3O_{7-\delta}$ Films, Applied Physics Letters, 30 May 1988, 1904–1906.

Matsui et al., Reactive Ion Beam Etching of Y-Ba-Cu-O Superconductors, Applied Physics Letters, 4 Jan. 1988, 69–71.

Mankiewich et al., Reproducible Technique for Fabication of Thin Films of High Transition Temperative Superconductors, Applied Physics Letters, 23 Nov. 1987, 1753–1755.

Primary Examiner—Kenneth M. Schor
Assistant Examiner—John J. Bruckner
Attorney, Agent, or Firm—Norman N. Spain

[57] ABSTRACT

A method of manufacturing a thin film of an oxidic superconducting material in accordance with a pattern, in which a pattern is manufactured by means of etching using reactive ions and a mask of aluminium oxide or silicon oxide, said method enabling patterns having line widths smaller than 2 μm to be manufactured with great accuracy without influencing the composition of the superconducting thin film in such a manner that the superconducting properties deteriorate.

4 Claims, 2 Drawing Sheets

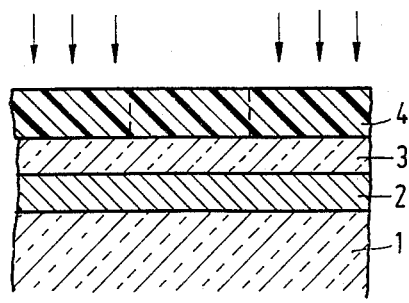
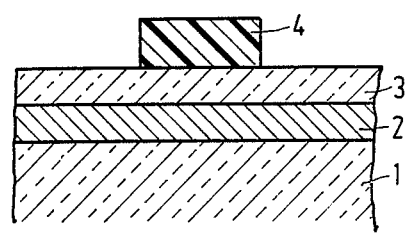
FIG.1a  FIG.1b
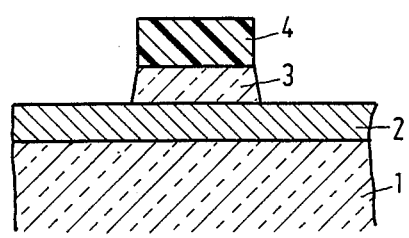
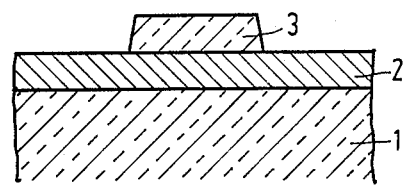
FIG.1c  FIG.1d
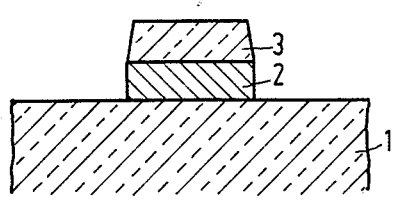
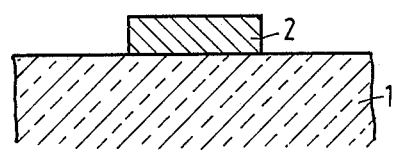
FIG.1e  FIG.1f

PLASMA ETCH OF MASKED SUPERCONDUCTOR FILM

BACKGROUND OF THE INVENTION

The invention relates to a method of manufacturing a thin film of an oxidic superconducting material in accordance with a pattern.

In an article by M. G. Blamire a.o., in J. Phys. D: Appl. Physics 20, pages 1330-1335 (1987) a description is given of a method in which a thin film of $YBa_2Cu_3O_{7-\delta}$ is applied to a substrate of aluminum oxide by means of magnetron sputtering, an intermediate layer of yttrium oxide being interposed. Conductor tracks having a width of 100 $\mu$m are formed in the thin film by means of a mechanical milling operation. This method has been selected to avoid having the thin film contacting aqueous solutions and because conventional etching techniques in which use is made of a reactive plasma are not available.

This known method has the disadvantage that patterns having small line widths, for example smaller than 10 $\mu$m, cannot be accurately manufactured by means of mechanical milling.

SUMMARY OF THE INVENTION

It is an object of the invention to provide a method of manufacturing a thin film of an oxidic superconducting material in accordance with a pattern, in which known methods in the field of semiconductor devices are used to manufacture patterns of small line widths and great accuracy without adversely affecting the properties of the oxidic material which determine the superconducting behaviour. The problem which occurs is that oxidic superconducting materials such as $YBa_2Cu_3O_{7-\delta}$ are subject to degradation when they contact water. Also contact with organic compounds is to be avoided as much as possible. If the pattern manufactured is to be processed further, for example to produce an electronic circuit device, precautions have to be taken so as to avoid damage to the superconducting material, for example, when subsequent layers or electric contacts are provided.

This object is achieved in accordance with the invention by means of a method which comprises the following steps:

a thin film of an oxidic superconducting material is provided on an electrically insulating substrate,
an inorganic masking layer is provided on a thin film of the superconducting material,
subsequently, a resist pattern is formed on the masking layer,
the inorganic masking layer is etched in a plasma in a mixture of trifluoromethane and argon, the resist pattern being used as a mask,
the resist pattern is removed,
the thin film of oxidic superconducting material is etched in a chlorine-containing plasma, the etched inorganic masking layer being used as a mask,
the inorganic masking layer is removed by means of a plasma treatment in a mixture of trifluoromethane and argon.

BRIEF DESCRIPTION OF THE DRAWING

In the drawing FIGS. 1a-f are cross-sectional views of a device showing at various stages during production of a patterned thin film of a superconducting material according to the method of the invention.

DETAILED DESCRIPTION OF THE INVENTION

Figure 2A:
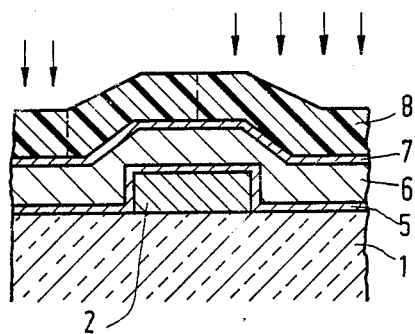
FIGS. 2a-d are cross-sectional views of a device at various stages of a method of providing an electric conduit on an oxidic superconducting thin film formed by the method of the invention.

For a more complete understanding the invention will now be described in greater detail.

The inorganic masking layer is preferably manufactured from aluminum oxide and/or silicon oxide.

In the method in accordance with the invention the superconducting film does not contact the material of the resist pattern or any solvent. It only contacts aluminum oxide or silicon oxide at temperatures which are so low that no diffusion of aluminum or silicon in the superconducting layer can take place. At temperatures exceeding 500° C. the use of aluminum oxide and/or silicon oxide in contact with $YBa_2Cu_3O_{7-\delta}$ leads to a substantial deterioration of the superconducting properties, for example to a decrease of the critical temperature. The composition of the gas in the plasmas used, in which reactive ion etching occurs, is selected such that the differences in etching rate between the various layers are sufficiently large to manufacture a pattern in a selective manner without using additional etch-stop layers.

An oxidic superconducting material which may be used in the method in accordance with the invention is $(La,Sr)_2CuO_4$, wherein Sr can be replaced by Ba. In a preferred embodiment of the method in accordance with the invention the oxidic superconducting material consists of $YBa_2Cu_3O_{7-\alpha-\delta}F_\alpha$, wherein $\alpha$ has a value of from 0 to 1 and wherein $\delta$ has a value of from 0.1 to 0.5 $YBa_2Cu_3O_{7-\delta}$ ($\alpha=0$) has a $T_c$ value of approximately 90 K. Oxygen can be partly replaced by fluorine, for example up to 1 atom in the compositional formula indicated, which leads to an increase of $T_c$. Further, Y may be substituted by one or more rare earth metals and Ba may be substituted by another alkaline earth metal, for example Sr. $T_c$ is the critical temperature below which the material exhibits superconducting behaviour.

The resist pattern may be provided in any suitable manner, for example by means of screen printing. In a preferred embodiment of the method in accordance with the invention, the resist pattern is provided by locally irradiating a radiation-sensitive resist, and subsequently developing it. For this purpose, both a positive and a negative resist may be used. The irradiation operation can be carried out using, for example, electrons, X-rays or light, in particular UV light. Local, patterned irradiation can be obtained, for example, by means of a mask or a moving radiation source.

A preferred embodiment of the method in accordance with the invention, in which a satisfying etching selectivity is obtained, is characterized in that the chlorine-containing plasma comprises at least one of the compounds HCl and $Cl_2$.

U.S. Pat. No. 4,439,294 describes a method of etching using reactive ions and a contact mask of aluminum oxide. The method is applied to ferrites, as an alternative to etching methods in which liquids are used, to preclude underetching problems. From this patent it cannot be derived that such a method can suitably be used with oxidic superconducting materials. This is in these materials the etching speed relative to that of aluminum oxide is important as well as the sensitivity of oxidic superconducting materials to a large number of chemical compounds, as has also been indicated in the above-mentioned article by M. G. Blamire a.o.

The invention will now be described in greater detail by means of an exemplary embodiment and with reference to the drawing.

EXAMPLE

According to the present example a substrate 1 of SrTiO$_3$ is used having a surface area of 5 cm$^2$, see FIG. 1a. Other suitable electrically insulating substrate materials that may be used are, for example, magnesium oxide and yttrium oxide, for example in the form of thin films on a mechanically stronger substrate.

A layer of YBa$_2$Cu$_3$O$_{7-\delta}$ having a thickness of 0.3 $\mu$m is provided on the substrate by means of triode sputtering, and is subsequently subjected to a treatment in oxygen at a temperature of 850° C. The layer 2 thus obtained is superconducting having a critical temperature of approximately 93 K. If desired, superconducting thin films may alternatively be provided by means of laser ablation or other suitable deposition methods. Methods of manufacturing thin films of oxidic superconducting materials such as (La,Sr)$_2$CuO$_4$ and YBa$_2$Cu$_3$O$_{7-\delta}$ are described by R. B. Laibowitz a.o. in Physical Review B, 35 (16), pages 8821–8823 (1987).

A layer of aluminum oxide 3 having a thickness of 0.3 $\mu$m is applied by means of R.F. sputtering to the layer 2. Alternatively, a layer of silicon oxide may be applied, a layer of silicon oxide, having for example a thickness of 0.5 $\mu$m, by sputtering or chemical deposition from the vapour phase at 300° C. The other steps of the method in which silicon oxide is used are the same as when aluminum oxide is used.

Subsequently, a layer 4 of a photoresist material is provided by means of spinning. A suitable photoresist material is, for example, a positive photoresist on the basis of novolak and diazoquinone, for example AZ 1350J by Hoechst. The photoresist material is dried for 20 minutes at 80° C. and subsequently exposed to UV light in accordance with a pattern by means of a mask for 45 seconds. Subsequently, the photoresist material is heated for 5 minutes to a temperature of 120° C.

Subsequently, the pattern is developed, see FIG. 1b, by means of an 0.1N solution of sodium hydroxide in water, rinsed, dried and maintained at a temperature of 120° C. for 15 minutes.

The aluminum oxide layer is etched in a plasma in a mixture of trifluoromethane, CHF$_3$, and argon in a volume ratio of 1:4. The temperature is 50° C., the pressure is approximately 2 Pa, the power applied to the plasma is 1 W/cm$^2$. The aluminum oxide is etched in the desired pattern by means of reactive ions in 25 minutes to produce the structure shown in FIG. 1c. It has been found that the oxidic superconducting material is etched at a rate which is 8 times slower than that of aluminum oxide.

The substrate and the layers it carries are heated to 180° C. in a nitrogen plasma at a pressure of 100 Pa and a power of 6 W/cm$^2$ being applied, after which the remaining resist material is removed in 25 minutes by means of an oxygen plasma at a pressure of 100 Pa and a power of 2 W/cm$^2$ being applied, thus forming the structure shown in FIG. 1d.

Subsequently, the oxidic superconducting material is etched in a plasma in HCl. The temperature is 50° C., the pressure is approximately 1 Pa and the power applied to the plasma is 2 W/cm$^2$. The superconducting material is etched in the desired pattern in 10 to 12 minutes the structure shown in FIG. 1e. A suitable value of the power applied to the plasma is of from being formed 0.5 to 2.5 W/cm$^2$. A suitable etching gas which may alternatively be used is Cl$_2$. The etching rate of the superconducting material is approximately 1.8 $\mu$m/h, the etching rate of the aluminum oxide is approximately 0.6 $\mu$m/h.

The remaining quantity of aluminium oxide is remove in about 6 minutes, to form the device FIG. 1f, by use of a plasma in trifluoromethane and argon, under the same conditions as described hereinbefore for forming a pattern in the aluminium oxide.

By means of the method described herein, patterns having line widths smaller than 2 $\mu$m were manufactured. Contacts for measuring the electrical properties are provided in the following manner.

The substrate and the pattern of oxidic superconducting material formed thereon are heated to 120° C. in a nitrogen plasma and are subsequently treated in an oxygen plasma at a pressure of 100 Pa for 20 minutes. This treatment enhances the bonding of the metal layers to be applied. Subsequently, the surface is purified by means of sputter etching for 1 minute.

Figure 2B:
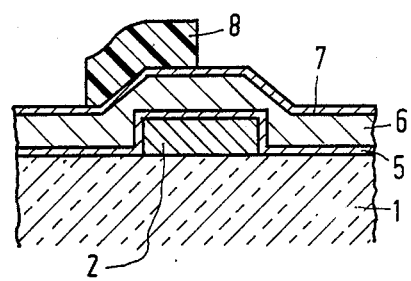

By means of vapour deposition, a layer of molybdenum 5 having a thickness of 60 nm, a layer of gold 6 having a thickness of 300 nm and a layer of molybdenum 7 having a thickness of 60 nm are provided in succession, on the patterned superconducting thin film 2 FIG. 2a. By means of spinning a layer 8 of a photoresist as shown material is provided thereon, for example a layer of the material as used in layer 4 as described hereinbefore. A resist pattern is formed by means of exposing and developing, as described hereinbefore, producing the structure shown in FIG. 2b.

At the areas which are not protected by the photoresist the molybdenum in layer 7 is etched by means of an etching solution comprising 70 parts by weight of phosphoric acid, 16 parts by weight of acetic acid, 3 parts by weight of nitric acid and 5 parts by weight of water, which solution does not attack gold.

Figure 2C:
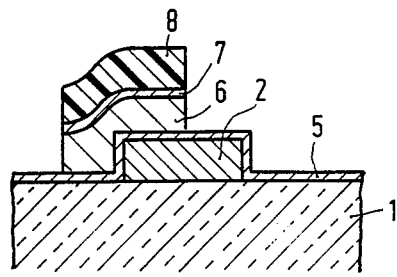

After rinsing and drying the gold in layer 6 is etched by means of an etching solution comprising 80 g of KI and 30 g of I$_2$ in 200 cm$^3$ of water, the layer of molybdenum 5 acting as a stop layer, the structure shown in FIG. 2c.

After rinsing and drying the remainder of the photoresist layer 8 is removed using acetone, after which the rinsing and drying operations are repeated.

Figure 2D:
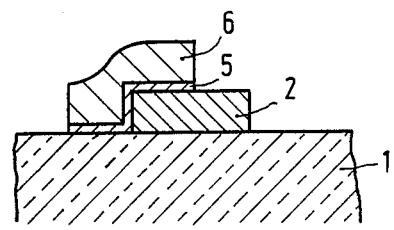

The remainder of molybdenum, in particular of layer 5, is removed by means of etching for 4 minutes in a plasma in a mixture of tetrafluoromethane and oxygen having a volume ratio of 1:25, the device shown in FIG. 2d being thereby formed. The temperature is 70° C., the pressure is 100 Pa, the power applied to the plasma is 0.5 W/cm$^2$.

The contacts are provided in such a manner that the superconducting material layer 2 does not directly contact water or organic compounds. In the case of a circuit manufactured in accordance with the present example it has been observed that superconductivity occurs at a critical temperature of 93 K.

What is claimed is:
1. A method of manufacturing a patterned thin film of a rare-earth-metal, alkali-earth-metal, copper oxide superconducting material on an electrically insulating substrate said method comprising:

(a) depositing a thin film of a rare-earth-metal, alkali-earth-metal, copper oxide superconducting material on an electrically insulating substrate, (b) depositing an inorganic masking layer on said thin film of superconducting material wherein said inorganic masking layer is manufactured from aluminum oxide and/or silicon oxide, (c) depositing an organic photoresist on said inorganic masking layer, (d) forming a patterned resist from said organic photoresist layer, (e) etching said inorganic masking layer according to the organic photoresist pattern, in a plasma in an atmosphere consisting essentially of a mixture of trifluoromethane and argon, while employing said patterned organic photoresist as a mask, (f) removing said organic photoresist, (g) etching said thin material of superconducting film, according to the inorganic masking layer, in a chlorine containing
plasma wherein said chlorine containing plasma comprises $Cl_2$ and/or HCl while employing said etched inorganic masking layer as a mask, and (h) removing said etched inorganic masking layer with a plasma in an atmosphere consisting essentially of a mixture of trifluoromethane and argon.

2. A method as claimed in claim 1 wherein the oxidic superconducting material comprises $YBa_2Cu_3O_{7-\alpha-\delta}F_\alpha$, wherein $\alpha$ has a value of from 0 to 1 and $\delta$ has a value of from 0.1 to 0.5.

3. A method of claim 1 wherein the patterned organic photoresist is formed by locally irradiating irradiation-sensitive organic resist and subsequently developing it.

4. The method of claim 3 wherein the patterned organic photoresist is removed by means of a plasma treatment in oxygen.

* * * * *